(12) United States Patent
Fukami

(10) Patent No.: US 7,129,759 B2
(45) Date of Patent: Oct. 31, 2006

(54) INTEGRATED CIRCUIT INCLUDING AN OVERVOLTAGE PROTECTION CIRCUIT

(75) Inventor: Ikuo Fukami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/035,060

(22) Filed: Jan. 14, 2005

(65) Prior Publication Data

US 2005/0168264 A1 Aug. 4, 2005

(30) Foreign Application Priority Data

Feb. 3, 2004 (JP) ............................ 2004-026603

(51) Int. Cl.
*H03K 3/00* (2006.01)
(52) U.S. Cl. .................. 327/110; 327/309; 327/314; 361/91.1; 361/111
(58) Field of Classification Search ................. 327/110
See application file for complete search history.

(56) References Cited

U.S. PATENT DOCUMENTS 5,028,811 A * 7/1991 Le Roux et al. ........... 327/110
5,119,265 A * 6/1992 Qualich et al. ............. 361/103
5,559,656 A * 9/1996 Chokhawala ................. 361/18
5,581,432 A * 12/1996 Wellnitz et al. ............. 361/56
6,087,877 A * 7/2000 Gonda et al. ............... 327/309

FOREIGN PATENT DOCUMENTS

JP    11-32429    2/1999

OTHER PUBLICATIONS

"Car Electronics and Reliability Enhancement of In-Vehicle Electronic Parts and Devices", first edition, Technical Institution Co., Ltd., Jul. 31, 1998, p. 31.

* cited by examiner

*Primary Examiner*—Timothy P. Callahan
*Assistant Examiner*—An T. Luu
(74) *Attorney, Agent, or Firm*—McGinn IP Law Group, PLLC

(57) ABSTRACT

The power IC includes an output transistor M0 which controls a current flowing into an L load, a dynamic clamp circuit which clamps an overvoltage, and a clamp control circuit which controls the operation of the dynamic clamp circuit. The clamp control circuit activates the dynamic clamp circuit, which is normally inactive, upon detection of a back EMF by the L load.

19 Claims, 9 Drawing Sheets

INTEGRATED CIRCUIT INCLUDING AN OVERVOLTAGE PROTECTION CIRCUIT

BACKGROUND OF THE INVENTION

1. Field of the Invention

The present invention relates to integrated circuits and, particularly, to an integrated circuit including an overvoltage protection circuit for an output MOS transistor.

2. Description of Related Art

A power integrated circuit (IC), which is also called a power semiconductor, is used in vehicles and home electric appliances to control a voltage and current. Miniaturization of the power IC is required.

For example, a vehicle has an actuator that converts an electrical signal into mechanical motion for fuel control or transmission control. A power IC is used to control on/off of the current flowing into the actuator.

FIG. 9 shows a normal vehicle electric system. An example is described in "CAR ELECTRONICS AND RELIABILITY ENHANCEMENT OF IN-VEHICLE ELECTRONIC PARTS AND DEVICES", first edition, Technical Institution Institute Co. Ltd, Jul. 31, 1989, p. 31 (FIG. 2). The vehicle electric system includes a power IC 91, an actuator 92, an ignition switch 93, a battery 94, an alternator 96, a field coil 97, and a regulator 98. The alternator 96 is connected to a battery 94 via a battery terminal 95. For example, if a user turns on the ignition switch 93, the battery 94, field coil 97, and power IC 91 are connected so that the battery 94 supplies a power supply voltage to the power IC 91 and the alternator 96 starts generating electric power.

The power IC 91 is turned on or off by a microcomputer (not shown), thereby controlling the current flowing into the actuator 92. The actuator 92 uses an equivalent circuit of inductance and resistance components, and it is called an L load due to having the inductance component. The L load is an engine valve solenoid, for example.

FIG. 10 shows an example of a circuit diagram of the power IC 91. The power IC 91 uses Metal Oxide Semiconductor Field Effect Transistor (MOSFET, which is also referred to hereinafter as MOS or MOS transistor) as a current control switch in a source follower. The power IC 91 is a high side switch since an output MOS transistor is connected closer to a battery than a load is. The load is the actuator 92 in this case.

In the power IC 91, the drain of an output MOS transistor M10 receives power through a power supply (Vbb) terminal. The gate of M10 receives a voltage which is boosted by a charge pump circuit 102 through a resistor R10. The source of M10 is connected to the actuator 92 via an output (OUT) terminal. The drain of a gate discharge MOS transistor N10 is connected between the charge pump circuit 102 and the resistor R10. The gate of N10 receives a control signal S12 and the source of N10 is connected to the OUT terminal.

A control signal S11 inputted by the microcomputer turns on or off the output of the charge pump circuit 102. The control signal S12 turns on or off the gate discharge MOS transistor N10.

Generally, there are two structural types of MOS transistors: a horizontal device in which a current flows parallel to a substrate surface, and a vertical device in which a current flows perpendicular to a substrate surface. The vertical device has a higher current-carrying capacity per unit area than the horizontal device since one of main electrodes is located in the bottom surface side of the semiconductor device. Thus, the vertical device is mainly used as a high power device. In this example, the output MOS transistor M10 is a vertical MOS transistor, and the gate discharge MOS transistor N10 is a horizontal MOS transistor.

FIG. 11 is an example of a timing chart of the power IC 91. The timing chart shows the state of each signal when the output MOS transistor M10 changes from off to on and then from on to off. The transition period until the MOS transistor is completely turned off is called "turn-off". The following explanation simply uses the word "off" "on", and "turn-off" to refer to the off, on, and turn-off of the output MOS transistor, respectively.

To turn on the output MOS transistor M10, the control signal S11 is set to High level and the control signal S12 is set to Low level. The boosted voltage from the charge pump circuit 102 is thereby supplied to the gate of the output MOS transistor M10 through the resistor R10. This increases a gate voltage VGS between the gate and the source of the output MOS transistor M10 to turn on the output MOS transistor M10. This allows an output current IOUT to flow into the actuator 92 so that an output voltage VOUT is applied.

On the other hand, to turn off the output MOS transistor MO,i the control signal S11 is set to Low level and the control signal S12 is set to High level. The gate discharge MOS transistor N10 is thereby turned on, and the gate charge of the output MOS transistor M10 is flows into the OUT terminal through the resistor R10 and the gate discharge MOS transistor N10. This decreases the gate voltage VGS to turn off the output MOS transistor M10. The output of the output current IOUT and the output voltage VOUT thereby stops.

As shown in the waveform of the output voltage VOUT in FIG. 11, a back electromotive force (hereinafter as back EMF) Vinv, which is a negative voltage, occurs in the turn-off period. This is because energy of $½*L*I2$ is accumulated in the inductance component of the L load when a current flows into the actuator 92 in the on period, and the energy is released in the off period. The back EMF Vinv is theoretically an infinite voltage, and the voltage is applied until it reaches the output withstand voltage of the output MOS transistor M10. This can cause characteristics degradation or destruction of the output MOS transistor M10.

In order to prevent the back EMF Vinv from exceeding the output withstand voltage of the output MOS transistor M10, the power IC 91 places a dynamic clamp circuit 101 between the gate and the drain of the output MOS transistor M10. The dynamic clamp circuit 101 includes a withstand voltage diode D101 and a backflow prevention diode D102. The withstand voltage diode D101 is a Zener diode.

In the turn-off period, the output voltage VOUT decreases as the gate voltage VGS decreases, and thereby the back EMF Vinv occurs. When the output voltage VOUT decreases to a breakdown withstand voltage of the withstand voltage diode D101, the back EMF Vinv is clamped by the breakdown withstand voltage, thereby preventing the voltage from reaching the output withstand voltage of the output MOS transistor M10.

In some cases, a surge voltage called a dump surge occurs in the power IC 91. The dump surge is a positive voltage which occurs in the Vdd terminal of the power IC 91 when a battery terminal 95 is detached while an alternator 96 is generating electric power.

FIG. 12 is a timing chart when the dump surge occurs. The voltage of the Vbb terminal is usually 12V, which equals to the voltage of the battery 94. Upon occurrence of dump surge, it increases to about 60V for 0.2 to 0.4 seconds. Since the voltage of the Vbb terminal exceeds the breakdown withstand voltage of the withstand voltage diode D101 when the dump surge occurs, a clamp function is activated. This results in temporal increase in the gate voltage VGS to turn on the output MOS transistor M10, thus outputting the output current IOUT and the output voltage VOUT.

In consideration of the dump surge, it is necessary that the breakdown withstand voltage of the withstand voltage diode D101 is not less than 60V, the dump surge. This is because, if the dump surge occurs when the output MOS transistor M10 is off, the clamp function of the dynamic clamp circuit 101 is activated, which causes the output MOS transistor M10 to be broken down due to heat. It is also necessary that the output withstand voltage of the output MOS transistor M10 is not less than the breakdown withstand voltage of the withstand voltage diode D101.

For example, the breakdown withstand voltage of the withstand voltage diode D101 is set to 70V, which is a dump surge of 60V plus a margin voltage of 10V. In this case, the output withstand voltage of the output MOS transistor M10 is preferably 90V, having a margin voltage of 20V for device variation.

Since the output withstand voltage of the output MOS transistor M10 and a chip area are proportional, the chip area of this power IC increases compared to the power IC which does not have the dynamic clamp circuit 101. The increase in the chip area causes higher costs and a larger mounting surface.

A low side switch having a dynamic clamp circuit is described in Japanese Unexamined Patent Publication No. 11-32429.

As described above, the present invention has recognized that conventional integrated circuits such as power IC have the problem that placing the dynamic clamp circuit increases a chip area to cause higher costs and a larger mounting surface.

SUMMARY OF THE INVENTION

According to one aspect of the invention, there is provided an integrated circuit which includes an output transistor connected between a power supply and an inductive load, and controlling a current flowing into the inductive load; a clamp circuit clamping an overvoltage applied to the output transistor; and a clamp control circuit activating the clamp circuit upon detection of a back electromotive force (EMF) by the inductive load. In this integrated circuit, the clamp circuit operates only when a back EMF occurs, such as in a turn-off period. This allows a withstand voltage of the output transistor to be set without consideration of a withstand voltage of the clamp circuit and so on; thus, the withstand voltage can be set low. It is thereby possible to reduce a circuit area of the output transistor and a chip area.

According to another aspect of the invention, there is provided an integrated circuit which includes an output transistor having a drain connected to a power supply and a source connected to an inductive load; a first transistor and a dynamic clamp circuit connected in series between the power supply and a gate of the output transistor; and a second transistor connected between the power supply and the inductive load, and turning on or off the first transistor according to a change in a gate voltage of the output transistor. In this integrated circuit, the dynamic clamp circuit operates only when a back EMF occurs, such as in a turn-off period. This allows a withstand voltage of the output transistor to be set without consideration of a withstand voltage of the dynamic clamp circuit and so on; thus, the withstand voltage can be set low. It is thereby possible to reduce a circuit area of the output transistor and a chip area.

According to yet another aspect of the invention, there is provided an integrated circuit which includes a high side switching device driving an inductive load; a control voltage generation circuit generating a control voltage which controls an operation of the high side switching device; and a back electromotive force (EMF) protection circuit protecting the high side switching device from a back electromotive force when the control voltage changes. In this integrated circuit, the back EMF protection circuit operates only when a back EMF occurs, such as in a turn-off period. This allows a withstand voltage of the high side switching device to be set without consideration of a withstand voltage of the back EMF protection circuit and so on; thus, the withstand voltage can be set low. It is thereby possible to reduce a circuit area of the high side switching device and a chip area.

The present invention can prevent an increase in a chip area, reduce costs, and avoid an increase in a mounting area, even with the dynamic clamp circuit.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
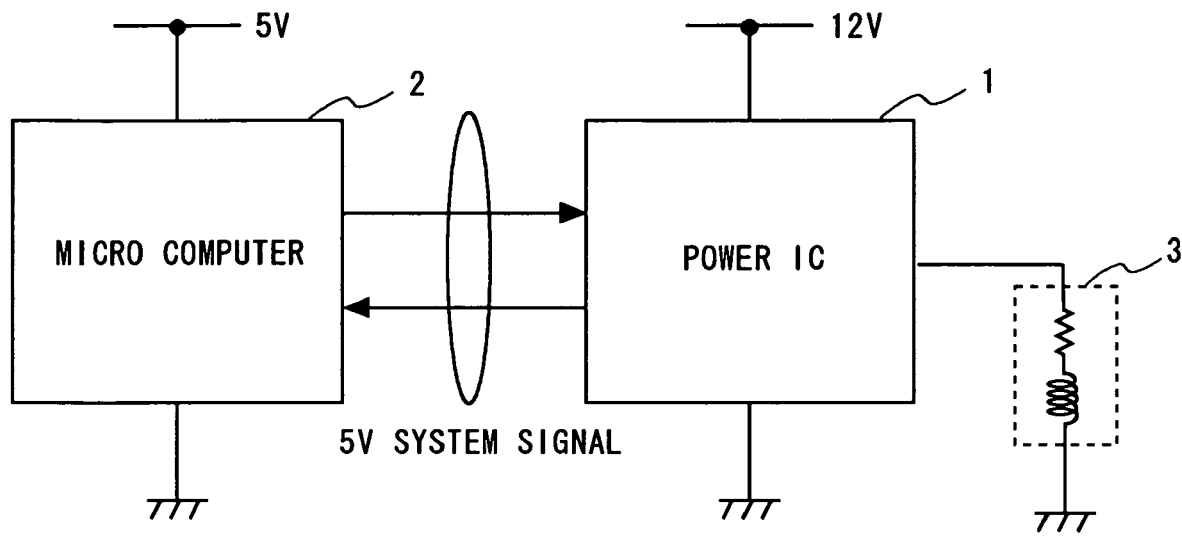
FIG. 1 is a block diagram of a system having a power IC of the invention.

Referring first to FIG. 1, the configuration of a system having a power IC according to a first embodiment of the invention is explained. The system controls the current flowing into an L load. It includes a power IC 1, a microcomputer 2, and an L load 3. Though the power IC 1 and the microcomputer 2 are each an integrated circuit on one chip in this example, they may be implemented on a given number of chips.

The microcomputer 2 is connected to the power IC 1 to exchange signals. The microcomputer 2 transmits to the power IC 1 a control signal which controls the current of the L load 3 and receives from the power IC 1 a diagnostic signal which indicates the state of the power IC 1 and so on. The microcomputer 2 is, for example, driven by a power source of 5V, and the signal transmitting to or receiving from the power IC 1 has an amplitude of 5V.

The power IC 1 is connected to the microcomputer 2 and to the L load 3. The power IC 1 controls the current flowing into the L-load 3 in accordance with the control signal from the microcomputer 2. The power IC 1 also diagnoses the states of the power IC 1 and the L-load 3 and transmits the diagnosis signal to the microcomputer 2. The power IC 1 is driven by a power source of 12V, for example.

One end of the L load 3 is connected to the power IC 1 and the other end is grounded. The L load 3 is an actuator and so on, which receives a current from the power IC 1 and converts the current into mechanical motion. The L load 3 is an equivalent circuit of inductance and resistance components.

This system may be used in vehicles, home electric appliances, robots, and so on. The system is configured to generate a back EMF in the turn-off period and generates an overvoltage such as dump surge in the periods different from the turn-off period.

Figure 2:
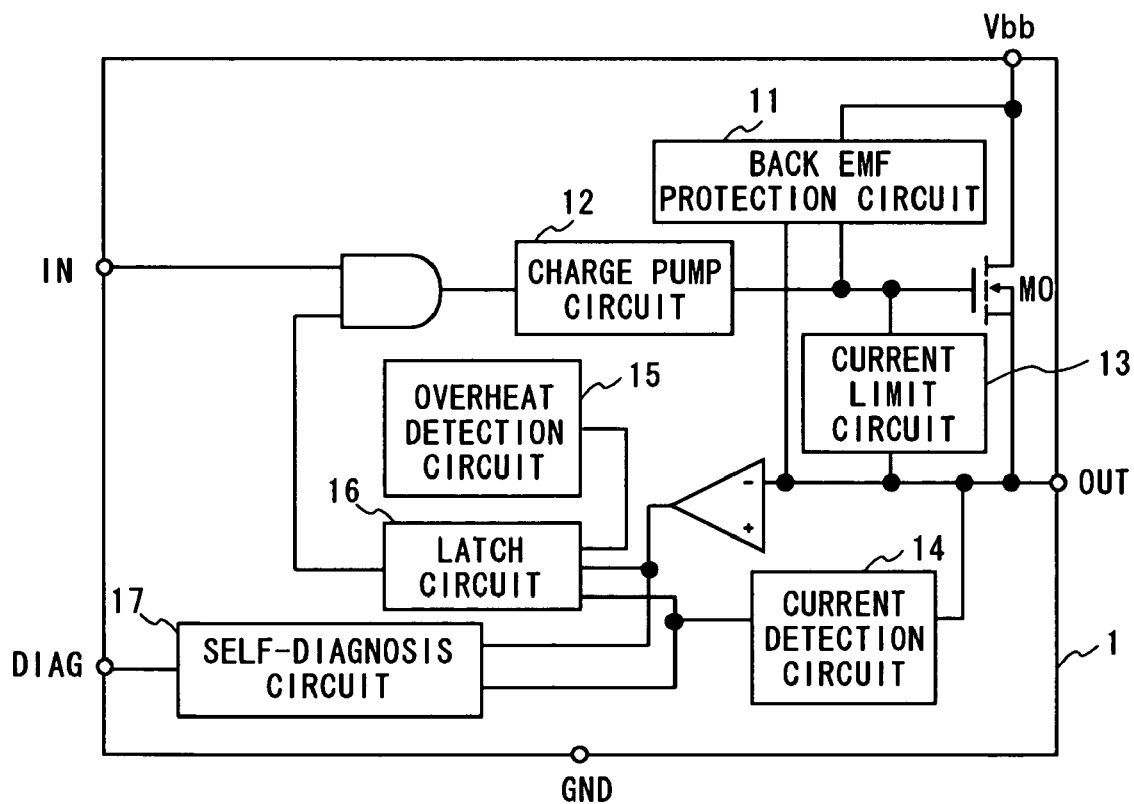
FIG. 2 is a block diagram of a power IC of the invention.

Referring next to FIG. 2, the configuration of the power IC of this embodiment is explained. The power IC 1 is a high side switch and it includes an output MOS transistor M0, a back EMF protection circuit 11, a charge pump circuit 12, a current limit circuit 13, a current detection circuit 14, an overheat detection circuit 15, a latch circuit 16, and a self-diagnosis circuit 17. In the power IC 1, the circuits other than the output MOS transistor M0 are called control circuits. The power IC 1 does not necessarily have this configuration, and it may have another configuration. In particular, the parts other than the circuit described later and illustrated in FIG. 3 may be arbitrary.

The power IC 1 receives a control signal from the microcomputer 2 through an input (IN) terminal, and transmits a diagnosis signal to the microcomputer 2 through a diagnosis (DIAG) terminal. Further, the power IC 1 receives a supply voltage from a battery and so on through a power supply (Vbb) terminal, and outputs a current to the L load 3 through an output (OUT) terminal. Though the power IC 1 has a ground (GND) terminal, the GND terminal may be eliminated since this embodiment operates by monitoring not the voltage from GND but the voltage between the gate and the source of the output MOS transistor M0.

The output MOS transistor M0 is a switch (high side switching element) to control the current flowing into the L load 3. It is a vertical MOS transistor capable of high power operation. The output MOS transistor M0 may be either n-channel or p-channel. In the case of high side switch, use of a P-channel device allows a more simplified circuit than an N-channel device. However, in the same capacity, the N-channel device allows a smaller chip size (about half) than the P-channel device; thus, the N-channel type is preferred. Use of the N-channel MOS transistor for the high side switch forms a source follower configuration, in which the source voltage follows the gate voltage.

The output MOS transistor M0 needs to have an appropriate resistance component (on-resistance) to reduce power consumption when transferring a current to the L load 3. Use of the on-resistance of the MOS transistor requires the voltage between the gate and the source of the output MOS transistor M0 to be high enough (for example, 10V). Thus, the voltage boosted by the charge pump circuit 12 is supplied to the gate of the output MOS transistor M0.

The back EMF protection circuit 11 protects the output MOS transistor M0 from a back EMF that occurs in the turn-off period. The back EMF protection circuit 11 includes a dynamic clamp circuit 31 and a clamp control circuit 32, which are described later. It performs clamp operation only in the turn-off period when the back EMF occurs.

The charge pump circuit 12 outputs a voltage which is greater than a power supply voltage, which serves as a control voltage generator for generating the gate voltage (control voltage) of the output MOS transistor M0. The charge pump circuit 12 outputs a voltage boosted according to a control signal from the microcomputer 2. As described above, in order to use the on-resistance of the MOS transistor, if a battery voltage is 12V, for example, the charge pump circuit 12 supplies a boosted voltage of 22V to the gate of the output MOS transistor M0. The charge pump circuit 12 is constituted of a capacitor, a diode, and an oscillator, for instance.

The current limit circuit 13 controls the current flowing into the L load 3 when the L load 3 is short-circuited to the GND. The current detection circuit 14 detects the current higher than a predetermined level flowing-into the L load 3 and outputs a detection result to the self-diagnosis circuit 17. The overheat detection circuit 15 detects the temperature of the power IC 1 higher than a predetermined level and outputs a detection result to the self-diagnosis circuit 17 through the latch circuit 16. The latch circuit 16 latches the signal from the overheat detection circuit 15 and so on and outputs the signal to the self-diagnosis circuit 17 and so on. The self-diagnosis circuit 17 diagnoses the states of the L load 3 and the power IC 1 based on the signals from the current detection circuit 14 and the overheat detection circuit 15, and outputs a diagnosis signal to the microcomputer 2.

Figure 3:
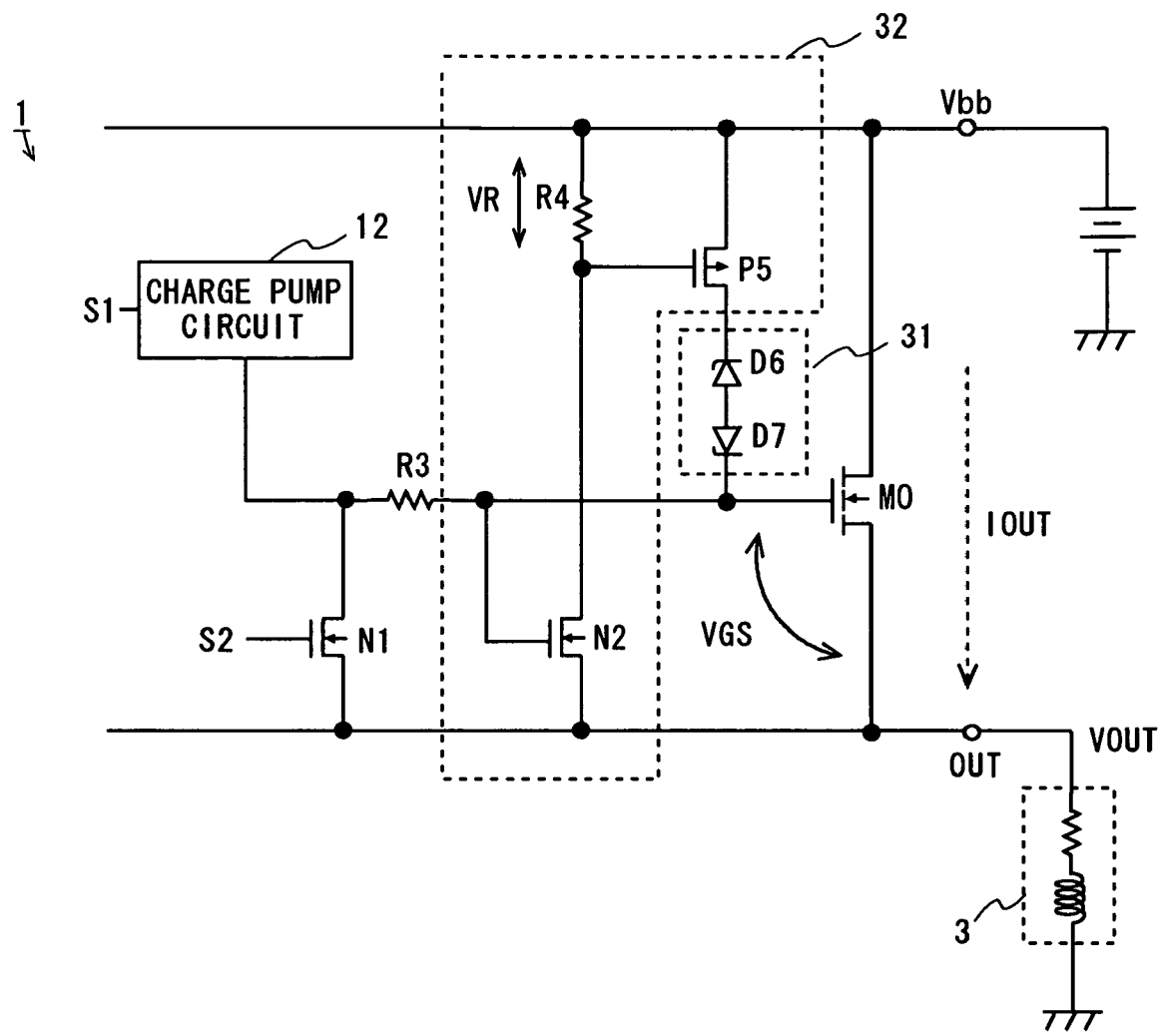
FIG. 3 is a circuit diagram of a power IC of the invention.

Referring then to FIG. 3, the circuit configuration of the power IC of this embodiment is explained. FIG. 3 illustrates a part of the power IC 1 in FIG. 2, including the output MOS transistor M0, the back EMF protection circuit 11, and the charge pump circuit 12.

The power IC 1 includes the output MOS transistor M0, the dynamic clamp circuit 31, the clamp control circuit 32, the charge pump circuit 12, a resistor R3, and a gate discharge MOS transistor N1. The dynamic clamp circuit 31 and the clamp control circuit 32 is included in the back EMF protection circuit 11 of FIG. 2, The resistor R3 and the gate discharge MOS transistor N1 are not illustrated in FIG. 2.

The charge pump circuit 12 is connected to the gate of the output MOS transistor M0 via the resistor R3. The charge pump circuit 12 turns on or off the output of a boost voltage according to the control signal Si from the microcomputer 2.

The drain of the gate discharge MOS transistor N1 is connected to a node between the charge pump circuit 12 and the resistor R3. The gate of N1 receives a control signal S2, and the source of N1 is connected to the OUT terminal. The gate discharge MOS transistor N1 is turned on or off according to the control signal S2 from the microcomputer 2. If the gate discharge MOS transistor N1 is on, the node between the charge pump circuit 12 and the resistor R3 is connected to the OUT terminal. The gate discharge MOS transistor N1 is an N-channel horizontal MOS transistor.

The clamp control circuit 32 includes a gate detection MOS transistor N2, a clamp switch MOS transistor P5, and a resistor R4. The clamp control circuit 32 activates or deactivates the operation of the dynamic clamp circuit 31 according to the gate voltage VGS of the output MOS transistor M0. The clamp control circuit 32 activates the dynamic clamp circuit 31 in the turn-off period when the back EMF occurs and deactivates the circuit 31 in normal times such as in the off period and the on period. The drain of the gate detection MOS transistor N2 is connected to the Vbb terminal via the resistor R4. The gate of N2 is connected to the gate of the output MOS transistor M0, and the source of N2 is connected to the OUT terminal. The gate detection MOS transistor N2 is turned on or off according to the gate voltage VGS of the output MOS transistor M0. If the detection MOS transistor N2 is on, the resistor R4 is connected to the OUT terminal. The gate detection MOS transistor N2 is an N-channel horizontal MOS transistor.

The source of the clamp switch MOS transistor P5 is connected to the Vbb terminal. The gate of P5 is connected to a node between the resistor R4 and the drain of the gate detection MOS transistor N2. The drain of P5 is connected to the dynamic clamp circuit 31. The clamp switch MOS transistor P5 is turned on or off according to a voltage VR on the resistor R4. If the clamp switch MOS transistor P5 is on, the Vbb terminal and the dynamic clamp circuit 31 are connected to activate the dynamic clamp circuit 31 so that the clamp operation can be performed. If, on the other hand, the clamp switch MOS transistor P5 is off, the Vbb terminal and the dynamic clamp circuit 31 are separated to deactivate the dynamic clamp circuit 31 so that the clamp operation cannot be performed. The clamp switch MOS transistor P5 is a P channel horizontal MOS transistor.

The dynamic clamp circuit 31 includes a withstand voltage diode D6 and a backflow prevention diode D7. The withstand voltage diode D6 is a Zener diode and it clamps the back EMF in the turn-off period with a breakdown withstand voltage. The backflow prevention diode D7 prevents backflow of a current from the gate to the drain of the output MOS transistor M0 due to a boosted voltage by the charge pump circuit 12 being higher than a power supply voltage of the Vbb terminal.

The withstand voltage diode D6 and the backflow prevention diode D7 are connected in series, with their anodes connected to each other. The cathode of the withstand voltage diode D6 is connected to the drain of the clamp switch MOS transistor P5. The cathode of the backflow prevention diode D7 is connected to the gate of the output MOS transistor M0. The configuration of the dynamic clamp circuit 31 is not limited to this example, and it may include a given number of diodes connected in series.

The drain of the output MOS transistor M0 is connected to the Vbb terminal. The gate of M0 is connected to the charge pump circuit 12 via the resistor R3. The source of M0 is connected to the OUT terminal.

Figure 4:
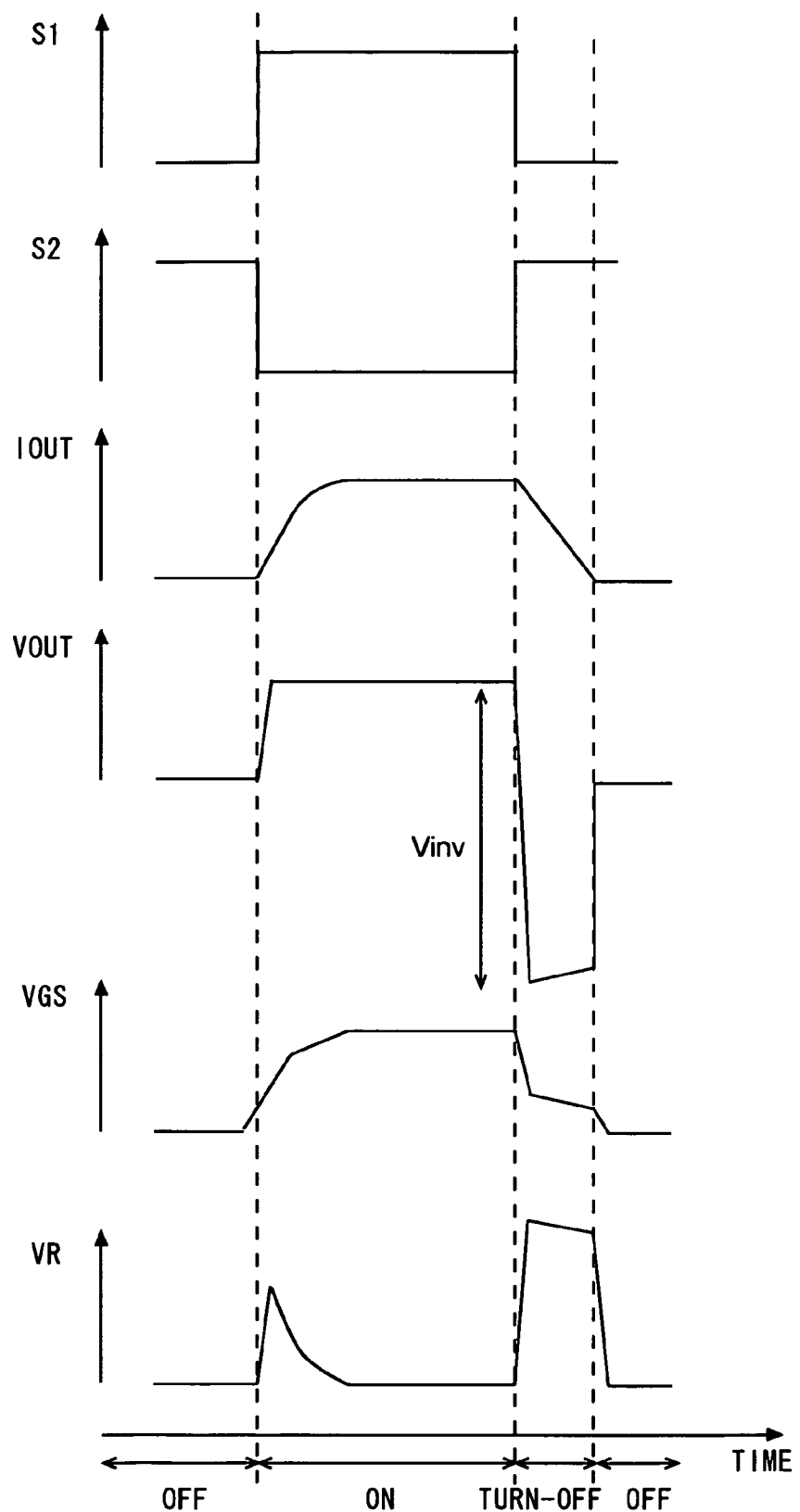
FIG. 4 is a timing chart of a power IC of the invention.

Referring now to the timing chart of FIG. 4, the operation of the power IC of this embodiment is explained. The timing chart shows the state of each signal when the output MOS transistor M0 is turned from off to on, and then turned back to off.

As shown in the chart, the control signal S1 is Low level when the output MOS transistor M0 is off, and it is High level when the transistor M0 is on. On the contrary, the control signal S2 is High level when the transistor M0 is off, and it is Low level when the transistor M0 is on.

To turn on the output MOS transistor M0, the control signal S1 is set to High level, and the charge pump circuit 12 thereby starts outputting a boosted voltage. Further, the control signal S2 is set to Low level to turn off the gate discharge MOS transistor N1. The boosted voltage of the charge pump circuit 12 is thereby supplied to the gate of the output MOS transistor M0 via the resistor R3. The gate voltage VGS of the output MOS transistor M0 thus increases to turn on the output MOS transistor M0. The output current IOUT thereby flows into the L load 3, and the output voltage VOUT is applied thereto.

To turn off the output MOS transistor M0, the control signal S1 is set to Low level, and the charge pump circuit 12 thereby stops outputting the boosted voltage. Further, the control signal S2 is set to High level to turn on the gate discharge MOS transistor N1. The charge of the gate of the output MOS transistor M0 thereby flows into the OUT terminal via the resistor R3 and the gate discharge MOS transistor N1. The gate voltage VGS thus decreases to turn off the output MOS transistor M0. This stops the output of the output current IOUT and the output voltage VOUT.

When the output MOS transistor M0 is off or on, no difference exists in the gate voltage VGS and also in the gate-source voltage of the gate detection MOS transistor N2, and the gate detection MOS transistor N2 is thus off. Further, the voltage VR does not occur in the resistor R4 and the clamp switch MOS transistor P5 is thus off. Hence, the dynamic clamp circuit 31 is deactivated and the clamp function does not operate.

In the turn-on period when the output MOS transistor MO changes from off to on, a difference occurs in the gate voltage VGS, and the gate detection MOS transistor N2 is thereby turned on. The voltage VR of the resistor R4 thus increases to turn on the clamp switch MOS transistor P5. Hence, the dynamic clamp circuit 31 is temporarily activated; however, since a back EMF by the L load 3 does not occur due to being the turn-on period, the clamp function still does not operate.

In the turn-off period of the output MOS transistor MO, a difference occurs in the gate voltage VGS and also in the gate-source voltage of the gate detection MOS transistor N2, and the gate detection MOS transistor N2 is thereby turned on. Thus, the voltage VR of the resistor R4 increases to turn on the clamp switch MOS transistor P5. This activates the dynamic clamp circuit 31. The back EMF Vinv occurs by the L load 3, and when it decreases to the breakdown withstand voltage of the withstand voltage diode D6, the withstand voltage diode D6 suffers avalanche breakdown, and an avalanche current flows into the gate of the output MOS transistor M0. Thus, the back EMF Vinv is clamped by the breakdown withstand voltage of the withstand voltage diode D6. In this way, this embodiment activates the dynamic clamp circuit 31 only in the turn-off period.

Figure 5:
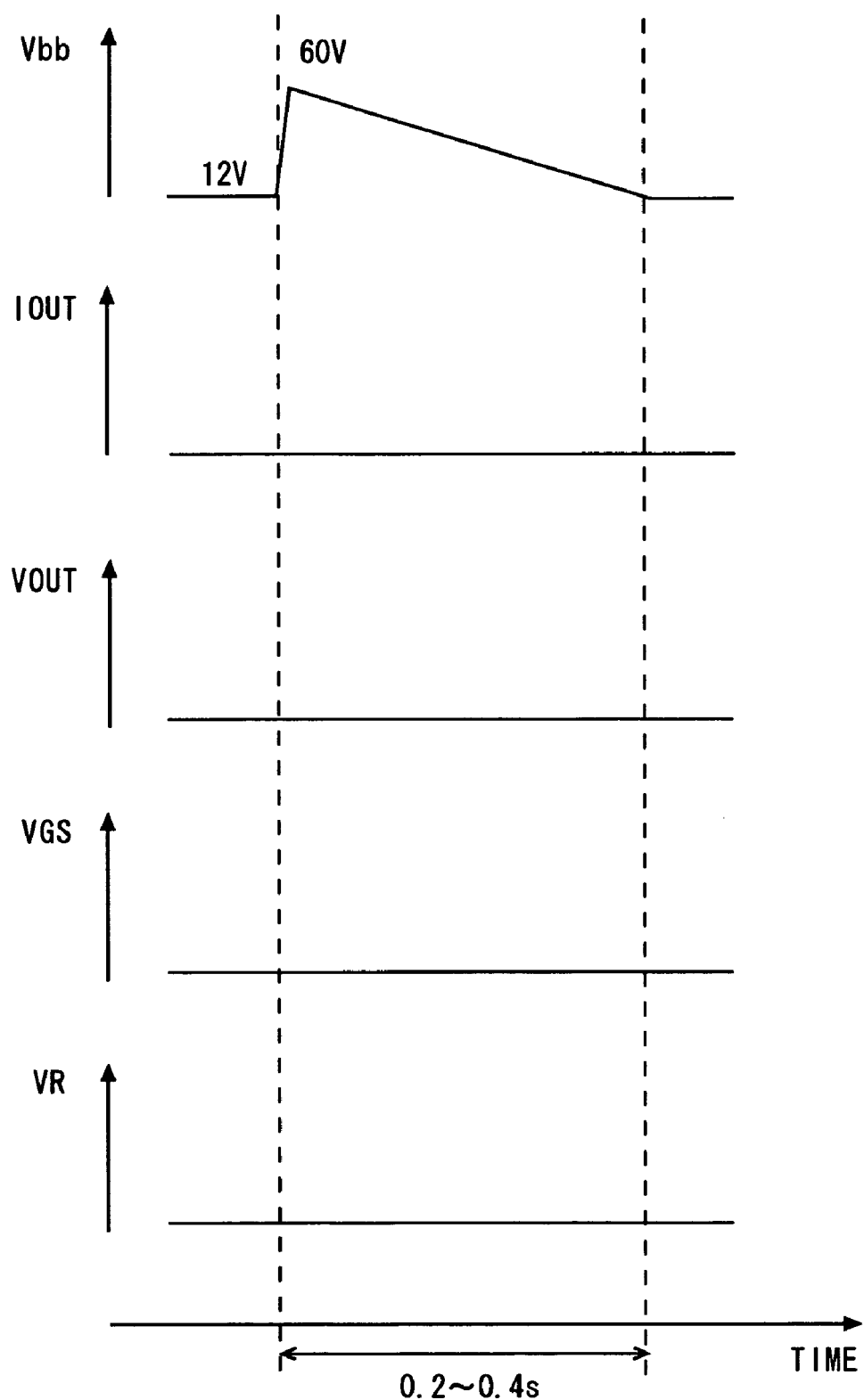
FIG. 5 is a timing chart of a power IC of the invention.

Referring then to the timing chart of FIG. 5, the operation of the power IC of this embodiment when dump surge occurs is explained. The timing chart shows the state of each signal when dump surge occurs in the off period of the output MOS transistor M0. Though the voltage of the Vbb terminal normally equals the power supply voltage, 12V, it increases to as high as 60V for 0.2 to 0.4 second due to the dump surge. As described above, if the output MOS transistor M0 is off, the voltage VR of the resistor R4 does not increase in spite of the occurrence of the dump surge; thus, the dynamic clamp circuit 31 remains deactivated and the gate voltage VGS does not increase. Hence, the output MOS transistor M0 stays off, not outputting the output current IOUT or the output voltage VOUT.

If the dump surge occurs in the on period of the output MOS transistor M0, on the other hand, the dynamic clamp circuit 31 is not activated, and the dump surge energy is consumed by the output MOS transistor M0 and the L load 3.

For example, if the resistance of the L load 3 is 10Ω, the on-resistance of the output MOS transistor M0 is 100 mΩ, and the dump surge of 60V is applied, the drain-source voltage of the output MOS transistor M0 is 0.59V (=60V*100 mΩ/10Ω), and the remaining 59.41V is applied to the L load 3. Since the resistance of the L load 3 is significantly greater (in this case, 100 times greater) than the on-resistance of the output MOS transistor M0, the energy is mostly consumed in the L load 3, which prevents the destruction of the output MOS transistor MO.

TABLE 1

| | Related art | Present embodiment | Difference |
|---|---|---|---|
| Withstand voltage of output MOS | 90 V (= 70 + 10 + 10) | 70 V (= 60 + 10) | −20 V |
| Breakdown withstand voltage of diode | 70 V (= 60 + 10) | 50 V (= 70 · 10 · 10) | −20 V |
| Area of output MOS | 9 mm$^2$ | 7 mm$^2$ | −2 mm$^2$ |
| Area of control circuit | 1 mm$^2$ | 1.01 mm$^2$ (= 1 + 0.003 + 0.003 + 0.005) | +0.01 mm$^2$ |
| Chip area | 10 mm$^2$ | 8.01 mm$^2$ | −1.99 mm$^2$ (−20%) |

Figure 10:
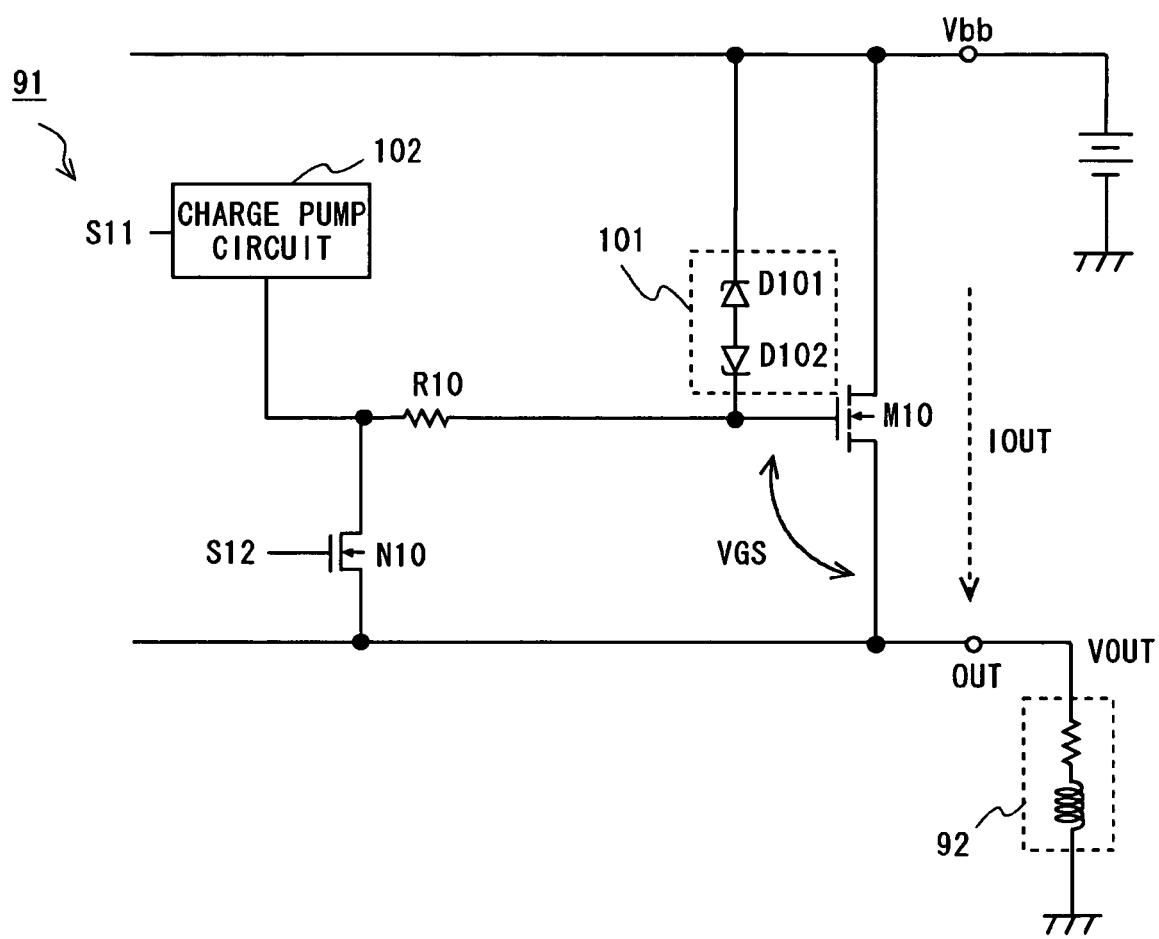
FIG. 10 is a circuit diagram of a power IC of a related art.
Figure 11:
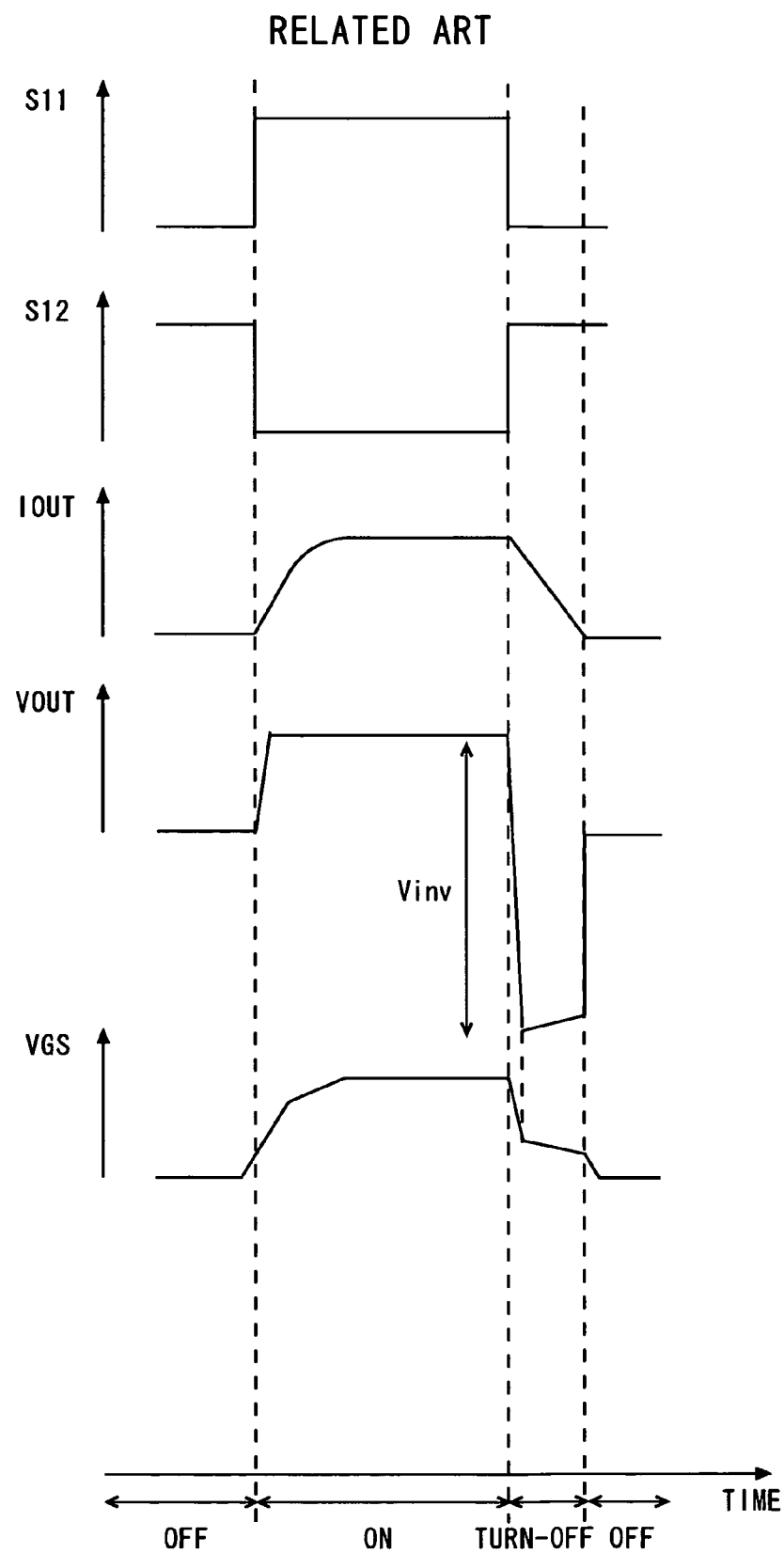
FIG. 11 is a timing chart of a power IC of a related art.
Figure 12:
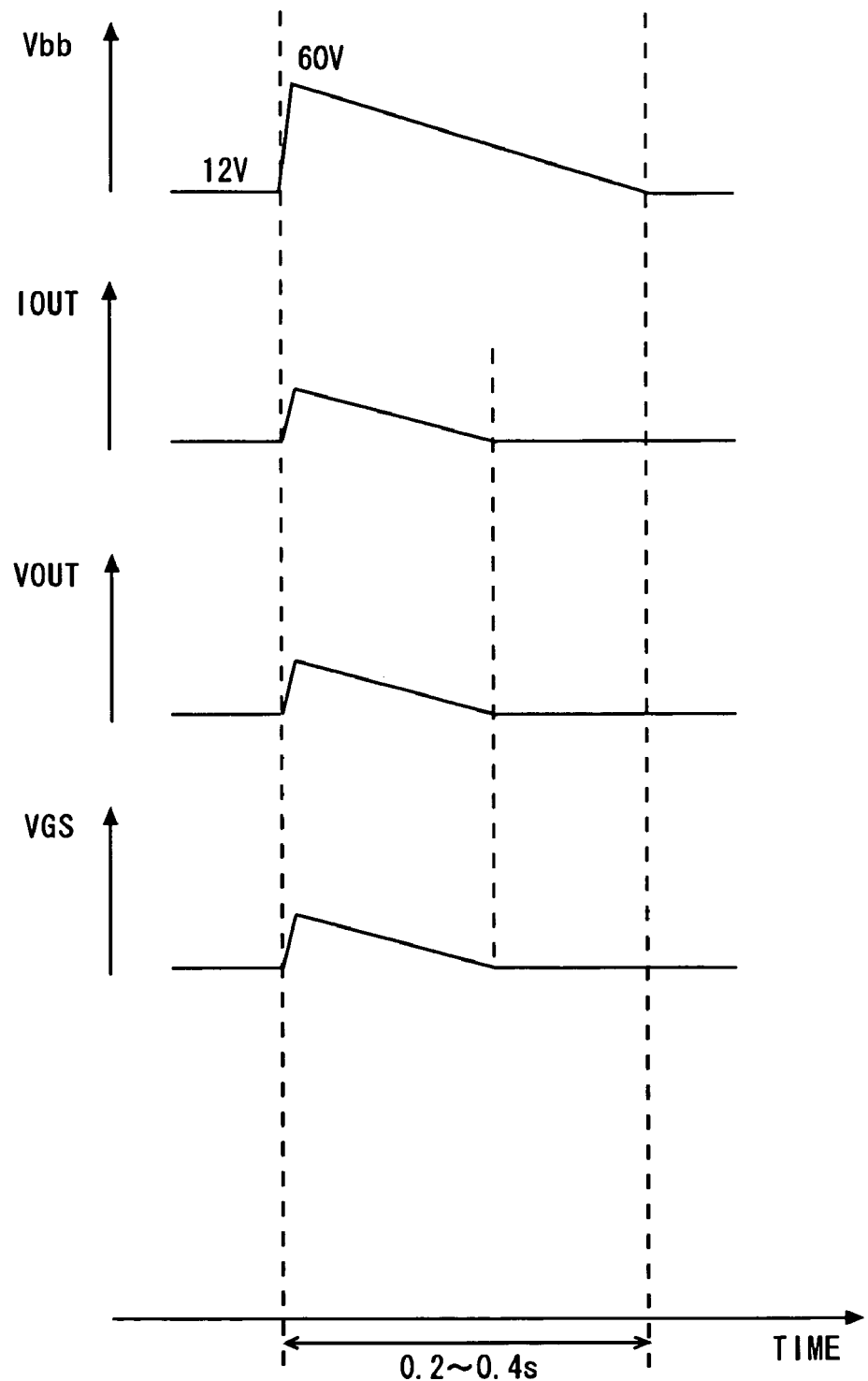
FIG. 12 is a timing chart of a power IC of a related art.

Table 1 shows an example of the calculation of the chip areas of the power ICs of a related art and this embodiment. The power IC 91 shown in FIG. 10 and the power IC 1 shown in FIG. 3 are compared here. The related art requires that the output withstand voltage of the output MOS transistor M10 is higher than the breakdown withstand voltage of the withstand voltage diode D101. The breakdown withstand voltage of the withstand voltage diode D101 is about 70V including is the dump surge 60V plus a margin voltage 10V. The output withstand voltage of the output MOS transistor M10 is about 90V in consideration of variation (±10V) of the withstand voltage diode and variation (±10V) of the output withstand voltage of the output MOS transistor M10. In this example, the device area of the output MOS transistor M10 is 9 mm$^2$, the device area of the control circuit which is the circuit other than the output MOS transistor M10 is 1 mm$^2$, and the chip area of the power IC 91 is thus 10 mm$^2$.

On the other hand, this embodiment only requires consideration of the output withstand voltage of the output MOS transistor M0 about the dump surge. Thus, the output withstand voltage of the output MOS transistor M0 is about 70V including the dump surge 60V plus a margin voltage 10V, which is 20V lower than in the related art. The breakdown withstand voltage of the withstand voltage diode D6 is 50V in consideration of variation (±10V) of the withstand voltage diode D6 and variation (±10V) of the output withstand voltage of the output MOS transistor M0, which is also 20V lower than in the related art. Since the output withstand voltage is 20V lower, the device area of the output MOS transistor M0 is 7 mm$^2$, which is 2 mm$^2$ smaller than in the related art. The device area of the control circuit is 1.01 mm$^2$, which is larger than in the related art by 0.01 mm$^2$ since the devices of the clamp control circuit 32 are added including the resistor R4 of 0.003 mm$^2$, the gate detection MOS transistor N2 of 0.003 mm$^2$, and the clamp switch MOS transistor P5 of 0.005 mm$^2$. The total chip area is 8.01 mm$^2$, which is smaller than the chip area of the related art by 1.99 mm$^2$. The chip size is thus reduced by 20%.

This embodiment activates the dynamic clamp circuit 31 only when the gate voltage of the output MOS transistor M0 changes. Thus, the dynamic clamp circuit 31 operates only when a back EMF occurs such as in the turn-off period. The dynamic clamp circuit 31 clamps the back EMF in the turn-off period, thereby effectively preventing the destruction of the output MOS transistor M0. Since the dynamic clamp circuit 31 does not operate in the periods other than the turn-off period, the energy such as dump surge is consumed by the output MOS transistor M0 and the L load 3. This permits the output withstand voltage of the output MOS transistor M0 to be set without consideration of the withstand voltage of the withstand voltage diode D6 of the dynamic clamp circuit 31, and the withstand voltage of the output MOS transistor M0 can be thus set low. This allows decrease in the circuit area of the output MOS transistor M0 and prevents increase in the chip area of the power IC to reduce costs and mounting area.

Second Embodiment

Figure 6:
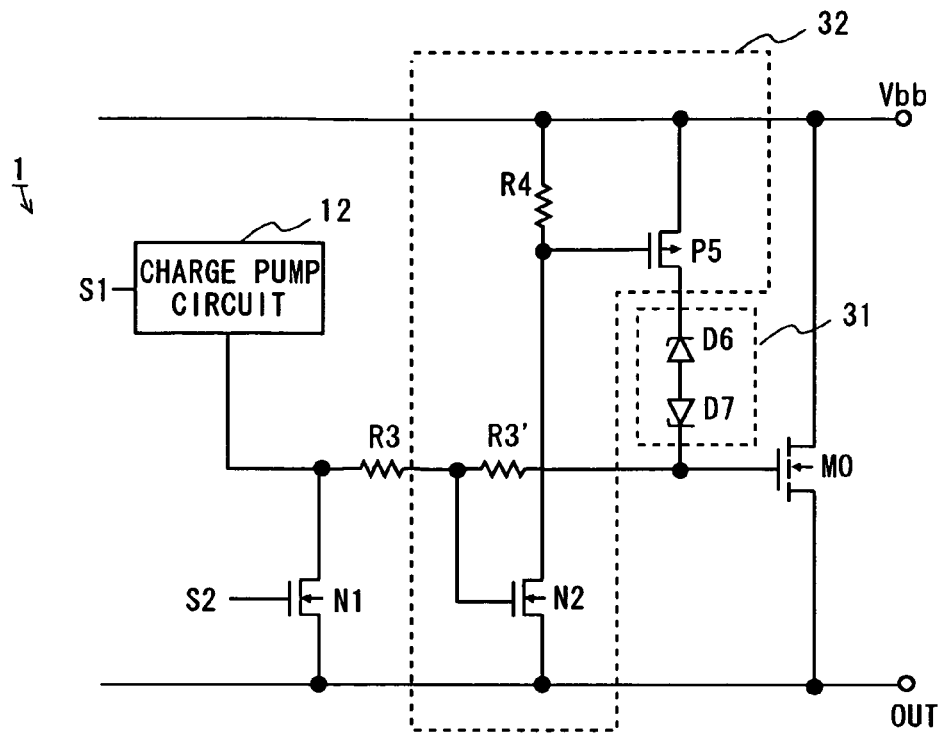
FIG. 6 is a circuit diagram of a power IC of the invention.

Referring now to FIG. 6, the circuit configuration of a power IC of a second embodiment is explained. Like FIG. 3, FIG. 6 illustrates the part of the circuit including the output MOS transistor M0, the back EMF protection circuit 11, and the charge pump circuit 12 of the power IC 1 of FIG. 2.

The power IC 1 of this embodiment has a resistor R3' between the resistor R3 and the gate of the output MOS transistor M0 in addition to the elements shown in FIG. 3. The gate of the gate detection MOS transistor N2 is connected to a node between the resistor R3 and the resistor R3'.

In this embodiment, the gate detection MOS transistor N2 refers to the gate voltage of the output MOS transistor M0 which drops across the resistor R3'. This configuration also allows the same operation as the configuration of FIG. 3.

Third Embodiment

Figure 7:
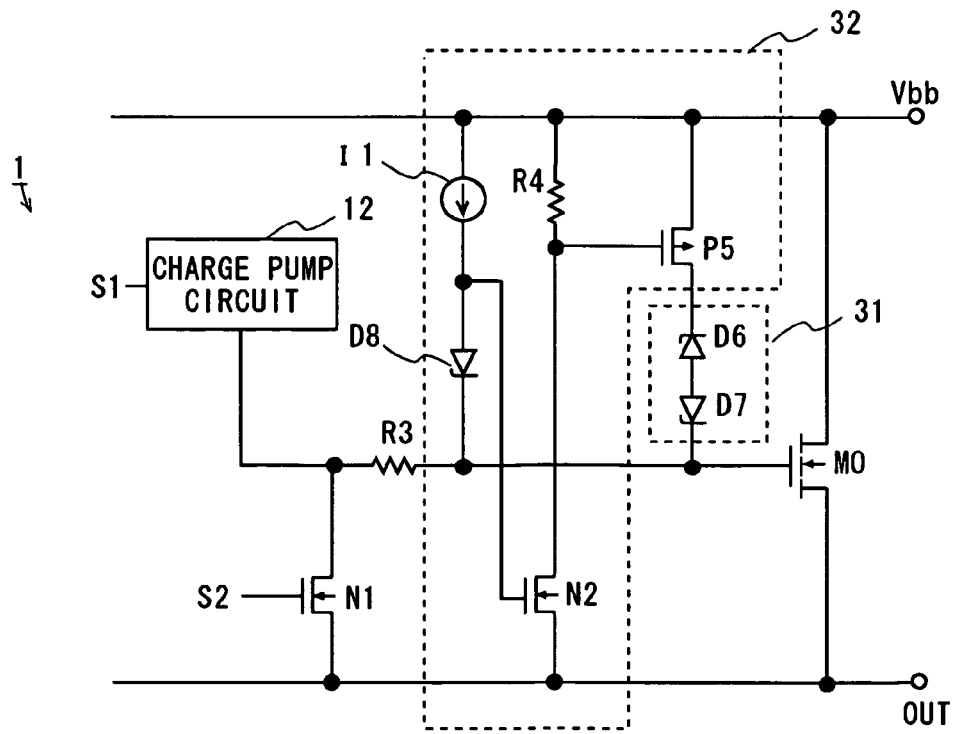
FIG. 7 is a circuit diagram of a power IC of the invention.

Referring then to FIG. 7, the circuit configuration of a power IC of a third embodiment is explained. Like FIG. 3, FIG. 7 illustrates the part of the circuit including the output MOS transistor M0, the back EMF protection circuit 11, and the charge pump circuit 12 of the power IC 1 of FIG. 2.

The power IC 1 of this embodiment has a constant current source I1 and a diode D8 between the Vbb terminal and the gate of the output MOS transistor M0 in addition to the elements shown in FIG. 3. The gate of the gate detection MOS transistor N2 is connected to a node between the constant current source I1 and the diode D8.

In this embodiment, the gate detection MOS transistor N2 refers to the gate voltage of the output MOS transistor M0 which is boosted by the diode D8. This configuration also allows the same operation as the configuration of FIG. 3.

Fourth Embodiment

Figure 8:
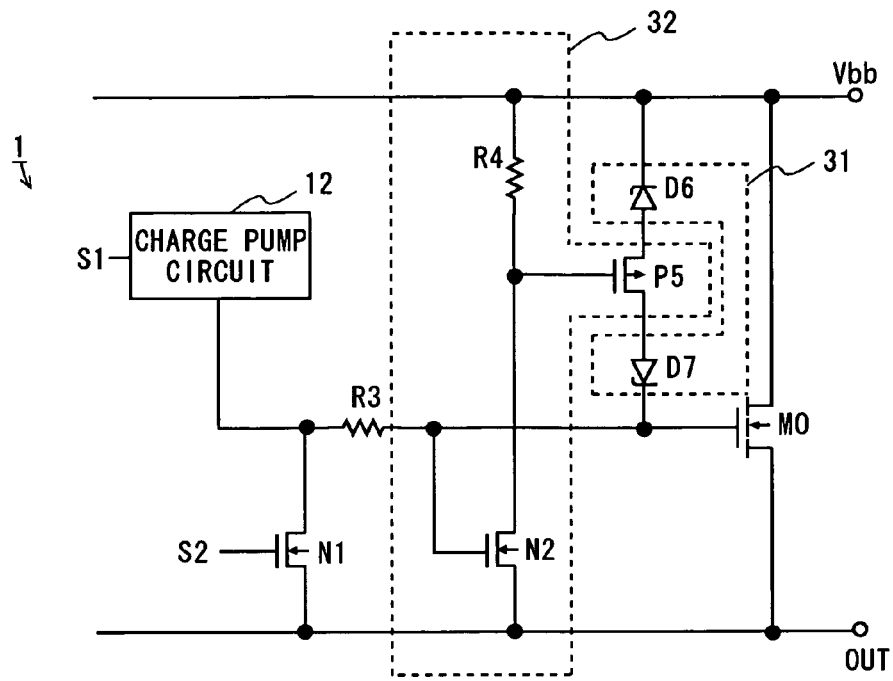
FIG. 8 is a circuit diagram of a power IC of the invention.
Figure 9:
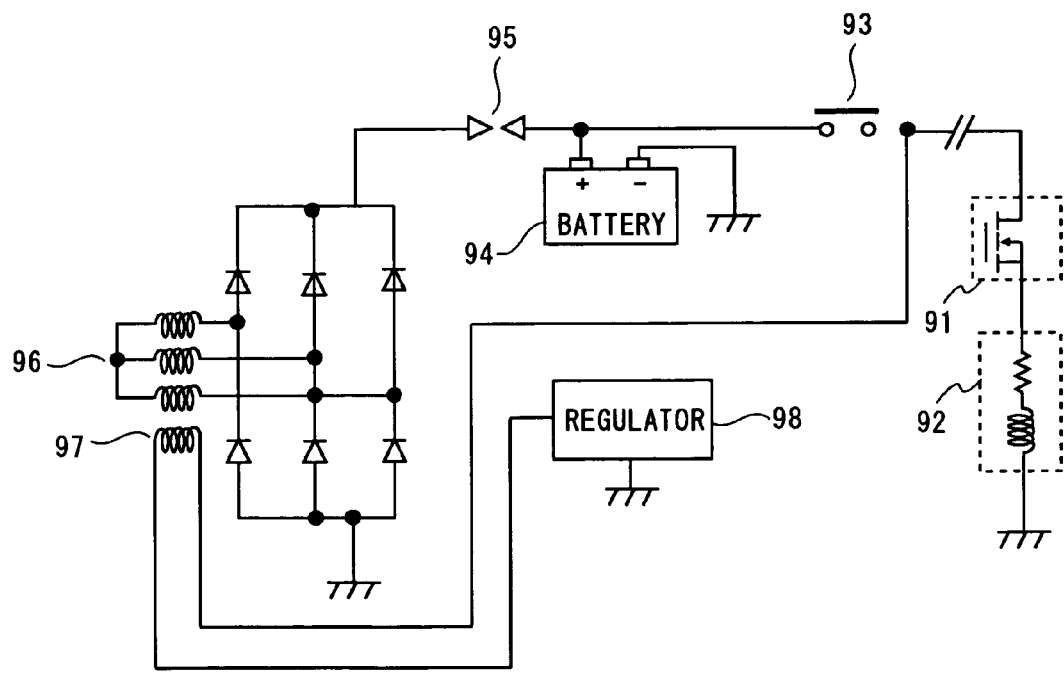
FIG. 9 is a block diagram of a vehicle electric system.

Referring then to FIG. 8, the circuit configuration of a power IC of a fourth embodiment is explained. Like FIG. 3, FIG. 8 illustrates the part of the circuit including the output MOS transistor M0, the back EMF protection circuit 11, and the charge pump circuit 12 of the power IC 1 of FIG. 2.

The power IC 1 of this embodiment places the clamp switch MOS transistor P5 between the withstand voltage diode D6 and the backflow prevention diode D7.

In this embodiment, the clamp switch MOS transistor P5 refers to the gate-source voltage which drops across the withstand voltage diode D6. This configuration also allows the same operation as the configuration of FIG. 3.

Other Embodiments

In the above-explained power ICs, the clamp control circuit refers to the gate voltage of the output MOS transistor to control the operation of the dynamic clamp circuit. However, it is not limited thereto. For example, the clamp control circuit may receive a control signal upon turn-off or occurrence of a back EMF to control the operation of the dynamic clamp circuit.

It is apparent that the present invention is not limited to the above embodiment that may be modified and changed without departing from the scope and spirit of the invention.

What is claimed is:

1. An integrated circuit, comprising:
   an output transistor adapted to be connected between a power supply and an inductive load for controlling a current flowing into the inductive load;
   a clamp circuit for clamping an overvoltage applied to the output transistor; and
   a clamp control circuit responsive to detection of a back electromotive force from the inductive load, for activating the clamp circuit,
   wherein the clamp control circuit comprises a gate detection transistor for detecting a change in the gate voltage of the output transistor and a clamp switch transistor for turning on or off the clamp circuit according to a state of the gate detection transistor.

2. The integrated circuit of claim 1, wherein the output transistor comprises an N-channel metal-oxide-semiconductor (MOS) transistor.

3. The integrated circuit of claim 1, wherein the output transistor comprises a vertical metal-oxide-semiconductor (MOS) transistor.

4. The integrated circuit of claim 1, wherein the clamp control circuit detects the back electromotive force by monitoring a gate voltage of the output transistor.

5. The integrated circuit of claim 4, wherein the clamp control circuit is responsive to a change in the gate voltage to activate the clamp circuit, and is responsive to a lack of change in the gate voltage to deactivate the clamp circuit.

6. The integrated circuit of claim 4, wherein the gate voltage comprises a potential difference between a gate of the output transistor and an output terminal to which the inductive load is connected.

7. The integrated circuit of claim 6, wherein the clamp control circuit is responsive to a change in the gate voltage to activate the clamp circuit, and is responsive to a lack of change in the gate voltage to deactivate the clamp circuit.

8. The integrated circuit of claim 6, wherein the clamp control circuit comprises:
   a gate detection transistor for detecting a change in the gate voltage of the output transistor; and
   a clamp switch transistor for turning on or off the clamp circuit according to a state of the gate detection transistor.

9. The integrated circuit of claim 1, wherein the output transistor comprises a high side switch.

10. The integrated circuit of claim 2, wherein the output transistor comprises a vertical metal-oxide-semiconductor (MOS) transistor.

11. An integrated circuit, comprising:
    an output transistor having a control terminal and having a current path connected between a power supply terminal and a load terminal;
    a clamp circuit for clamping an overvoltage applied to the output transistor; and
    a clamp control circuit responsive to a voltage difference between the current control terminal of the output transistor and the load connecting terminal, for controlling operation of the clamp circuit,
    wherein the clamp circuit is activated in a period that is variable corresponding to the voltage difference.

12. An integrated circuit, comprising:
    an output transistor having a drain, adapted to be connected to a power supply, and a source, adapted to be connected to an inductive load;
    a first transistor and a dynamic clamp circuit connected to a gate of the output transistor and adapted to be connected in series between the power supply and the gate of the output transistor; and
    a second transistor connected to the inductive load and adapted to be connected to the power supply, for turning on or off the first transistor according to a change in a gate voltage of the output transistor.

13. The integrated circuit of claim 12, further comprising a resistor, and wherein:
    the second transistor has a gate connected to the gate of the output transistor, a drain adapted to be connected to the power supply via the resistor, and a source adapted to be connected to the inductive load, and
    the first transistor has a gate connected to the drain of the second transistor, a source adapted to be connected to the power supply, and a drain connected to the dynamic clamp circuit.

14. The integrated circuit of claim 12, wherein the second transistor is responsive to a decrease of a preselected amount in the gate voltage of the output transistor to turn on the first transistor.

15. The integrated circuit of claim 14, further comprising a resistor, and wherein the gate of the second transistor is connected to the gate of the output transistor via the resistor.

16. The integrated circuit of claim 12, wherein the second transistor is responsive to an increase of a preselected amount in the gate voltage of the output transistor to turn on the first transistor.

17. The integrated circuit of claim 16, further comprising a diode, and wherein the gate of the second transistor is connected to the gate of the output transistor via the diode.

18. The integrated circuit of claim 12, wherein the dynamic clamp circuit comprises:
    a clamp diode for clamping an overvoltage; and
    a backflow prevention diode connected in series with the clamp diode for preventing current backflow.

19. The integrated circuit of claim 18, wherein the first transistor is connected between the clamp diode and the backflow prevention diode.

* * * * *